(12) United States Patent
Sakane (10) Patent No.: US 10,091,430 B2
(45) Date of Patent: Oct. 2, 2018

(54) SOLID-STATE IMAGING DEVICE AND DRIVING METHOD OF SAME

(71) Applicant: SONY CORPORATION, Tokyo (JP)

(72) Inventor: Seijiro Sakane, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/173,128

(22) Filed: Feb. 5, 2014

(65) Prior Publication Data

US 2014/0232913 A1    Aug. 21, 2014

(30) Foreign Application Priority Data

Feb. 19, 2013  (JP) ................................ 2013-030403

(51) Int. Cl.
| H04N 5/225 | (2006.01) |
| H04N 5/235 | (2006.01) |
| H04N 5/232 | (2006.01) |
| H04N 5/369 | (2011.01) |

(52) U.S. Cl.
CPC ......... *H04N 5/235* (2013.01); *H04N 5/23212* (2013.01); *H04N 5/3696* (2013.01)

(58) Field of Classification Search
CPC .................................................. H04N 5/3696
See application file for complete search history.

(56) References Cited

U.S. PATENT DOCUMENTS

| 6,727,950 B1 | 4/2004 | Nakata | |
| 6,829,008 B1* | 12/2004 | Kondo | G02B 7/34 |
| | | | 348/302 |
| 2008/0136948 A1* | 6/2008 | Muramatsu | 348/294 |
| 2008/0143858 A1* | 6/2008 | Kusaka | 348/294 |
| 2009/0086084 A1* | 4/2009 | Komaba | G03B 13/18 |
| | | | 348/349 |
| 2010/0176273 A1* | 7/2010 | Shimoda et al. | 250/208.1 |
| 2010/0259660 A1* | 10/2010 | Kukita | H04N 5/23241 |
| | | | 348/308 |
| 2010/0302433 A1* | 12/2010 | Egawa | G02B 7/34 |
| | | | 348/345 |
| 2011/0037868 A1* | 2/2011 | Ota | H04N 5/357 |
| | | | 348/222.1 |
| 2013/0076948 A1* | 3/2013 | Tanaka | 348/281 |
| 2013/0258131 A1* | 10/2013 | Hashimoto et al. | 348/222.1 |

FOREIGN PATENT DOCUMENTS

JP          2000-156823 A       6/2000

* cited by examiner

*Primary Examiner* — Twyler L Haskins
*Assistant Examiner* — Dwight Alex C Tejano
(74) *Attorney, Agent, or Firm* — Chip Law Group (57) ABSTRACT

A solid-state imaging device includes: a pixel array unit in which there are arrayed in a matrix form a plurality of pixels including a plurality of normal pixels which are pixels for video output, and a plurality of phase difference pixels which are pixels for focal-point detection; an A/D conversion unit configured to compare pixel signals output from the pixels of the pixel array unit with a ramp signal serving as a reference signal, thereby performing A/D conversion on the pixel signals; and a control unit configured to perform control so that the ramp signal to be compared with the phase difference pixels has a different slope from that of the ramp signal to be compared with at least a part of the normal pixels.

16 Claims, 10 Drawing Sheets

SOLID-STATE IMAGING DEVICE AND DRIVING METHOD OF SAME

CROSS REFERENCE TO RELATED APPLICATIONS

This application claims the benefit of Japanese Priority Patent Application JP 2013-030403 filed Feb. 19, 2013, the entire contents of which are incorporated herein by reference.

BACKGROUND

The present technology relates to a solid-state imaging device and a driving method thereof, and more particularly relates to a solid-state imaging device including phase difference pixels having improved A/D conversion resolution with minimal increase in A/D conversion time, and a driving method thereof.

There are solid-state imaging devices where phase difference pixels for focal-point detection are disposed in a pixel array unit including multiple pixels in a matrix form, in addition to normal pixels for video output (e.g., see Japanese Unexamined Patent Application Publication No. 2000-156823 (corresponding U.S. Pat. No. 6,829,008)).

An A/D converter is provided to the solid-state imaging device, which is configured to perform A/D conversion on analog pixel signals output from the pixels. The A/D converter compares analog pixel signals output from the pixels with a reference signal having a ramp waveform of which the level (voltage) changes in a stepwise manner according to passage of time (hereinafter, also referred to as ramp signal). Count processing is also executed in parallel with this comparison processing, and the digital value of a pixel signal is determined based on the count value at the time of completion of the comparison processing (e.g., see Japanese Unexamined Patent Application Publication No. 2011-244249 (corresponding U.S. Patent: US2013/0076948)).

SUMMARY

However, increasing A/D conversion resolution to improve focus precision in autofocus (AF) results in increased conversion time if the clock frequency is fixed, since A/D conversion is also performed on normal pixels with the same A/D conversion resolution.

It has been found to be desirable to improve A/D conversion resolution of phase difference pixels in a solid-state imaging device including the phase difference pixels, while minimizing increase in A/D conversion time.

A solid-state imaging device according to an embodiment of the present technology includes: a pixel array unit in which there are arrayed in a matrix form a plurality of pixels including a plurality of normal pixels which are pixels for video output, and a plurality of phase difference pixels which are pixels for focal-point detection; an A/D conversion unit configured to compare pixel signals output from the pixels of the pixel array unit with a ramp signal serving as a reference signal, thereby performing A/D conversion on the pixel signals; and a control unit configured to perform control so that the ramp signal to be compared with the phase difference pixels has a different slope from that of the ramp signal to be compared with at least a part of the normal pixels.

A driving method according to an embodiment of the present technology, is for a solid-state imaging device including a pixel array unit in which there are arrayed in a matrix form a plurality of pixels including a plurality of normal pixels which are pixels for video output, and a plurality of phase difference pixels which are pixels for focal-point detection. The driving method includes: comparing pixel signals output from the pixels of the pixel array unit with a ramp signal serving as a reference signal, thereby performing A/D conversion on the pixel signals; and performing control so that the ramp signal to be compared with the phase difference pixels has a different slope from that of the ramp signal to be compared with at least a part of the normal pixels.

According to the above configurations, pixel signals output from the pixels in the pixel array unit are compared with a ramp signal serving as a reference signal, thereby performing A/D conversion on the pixel signals. The ramp signal to be compared with the phase difference pixels and the ramp signal to be compared with at least a part of the normal pixels are controlled so as to have a different slope.

A solid-state imaging device according to an embodiment of the present technology includes: a pixel array unit in which there are arrayed in a matrix form a plurality of pixels including a plurality of normal pixels which are pixels for video output, and a plurality of phase difference pixels which are pixels for focal-point detection; a selector unit configured to selectively output a first ramp signal and a second ramp signal; and an A/D conversion unit configured to compare pixel signals output from the pixels of the pixel array unit with a ramp signal output from the selector unit, thereby performing A/D conversion on the pixel signals.

According to this configuration, pixel signals output from the pixels in the pixel array unit are compared with a ramp signal output from the selector unit. A/D conversion is thus performed on the pixel signals.

The solid-state imaging device or electronic device may be a stand-alone device or may be a module incorporated in another device.

According to the above configurations, A/D conversion time may further be reduced.

DETAILED DESCRIPTION OF EMBODIMENTS

Hereinafter, modes for carrying out the present technology (hereinafter, referred to as embodiments) will be described. Note that description will be made in accordance with the following order.

1. First Embodiment (method according to a solid-state imaging device having one digital to analog converter (DAC))
2. Second Embodiment (method according to a solid-state imaging device having two DACs)

1. First Embodiment

1-1. Overall Configuration Example of Solid-State Imaging Device

Figure 1:
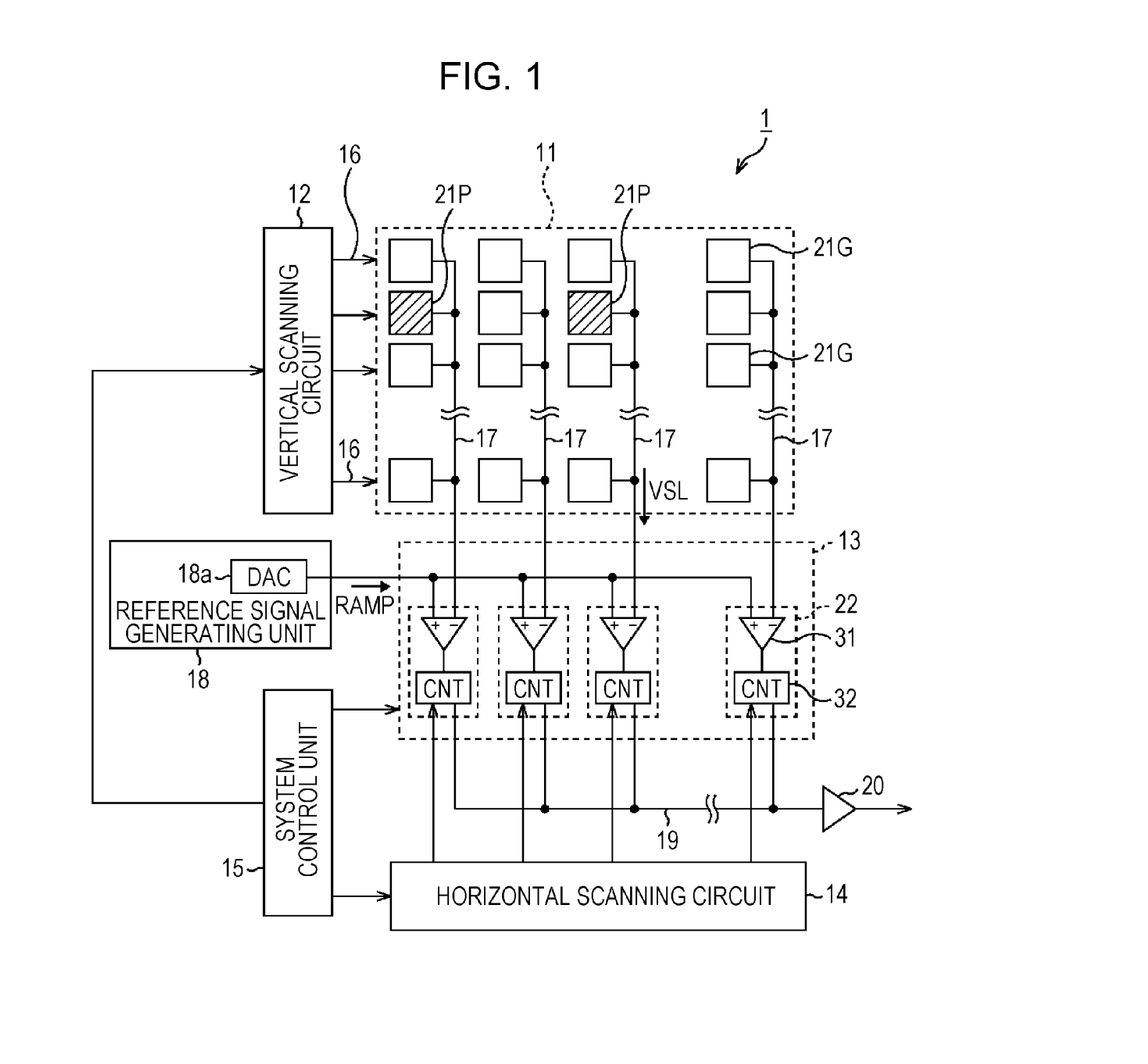
FIG. 1 is a block diagram illustrating a schematic configuration of a solid-state imaging device according to a first embodiment of the present technology.

FIG. 1 is a block diagram illustrating a schematic configuration of a solid-state imaging device according to a first embodiment of the present technology. A solid-state imaging device 1 illustrated in FIG. 1 includes a pixel array unit 11, a vertical scanning circuit 12, an A/D conversion unit 13, a horizontal scanning circuit 14, a system control unit 15, pixel driving lines 16, vertical signal lines 17, a reference signal generating unit 18, a horizontal output line 19, an output unit 20, and so forth.

The pixel array unit 11 is configured such that pixels 21, each including a photoelectric conversion unit configured to generate and store optical charges according to amount of received light, are disposed in a row direction and in a column direction, that is, two-dimensionally disposed in a matrix form. Here, the term "row direction" means the array direction of the pixels 21 in pixel rows, that is, the horizontal direction, and the term "column direction" means the array direction of the pixels 21 in pixel columns, that is, the vertical direction.

The pixels 21 two-dimensionally disposed in a matrix form include two kinds of pixels, which are normal pixels 21G for video output, and phase difference pixels 21P for focal-point detection. The layout of the phase difference pixels 21P in the pixel array unit 11 will be described later with reference to FIG. 2.

The pixels 21 each include a photoelectric conversion unit, formed by layering in the depth direction of a substrate, and multiple pixel transistors (so-called metal-oxide-semiconductor (MOS)) transistors). The multiple pixel transistors are, for example, four transistors which are a transfer transistor, a selection transistor, a reset transistor, and an amplification transistor.

Also, the pixels 21 may have a shared pixel configuration. This shared pixel configuration includes multiple photodiodes, multiple transfer transistors, a single floating diffusion to be shared (floating diffusion area), and one each of other pixel transistors to be shared. In other words, the photodiodes and transfer transistors, which make up multiple unit pixels, share one each of the other pixel transistors in this shared pixel configuration.

The matrix pixel array of the pixel array unit 11 is connected in increments of pixel rows in the horizontal direction by pixel driving lines 16, and connected in increments of pixel columns in the vertical direction by vertical signal lines 17. The pixel driving lines 16 transmit driving signals for performing driving at the time of reading out pixel signals VSL from the pixels 21. Though FIG. 1 illustrates the pixel driving lines 16 each as being a single wire, the pixel driving line 16 is not restricted to a single wire. One end of the pixel driving line 16 is connected to an output end corresponding to each pixel row of the vertical scanning circuit 12.

The vertical scanning circuit 12 includes a shift register, an address decoder, and so forth, and drives the pixels 21 in the pixel array unit 11 all at the same time, in increments of rows, or the like. Though a specific configuration of the vertical scanning circuit 12 is omitted from illustration, the vertical scanning circuit 12 generally has a configuration including two scanning systems which are a readout scanning system and a sweep scanning system.

The readout scanning system selectively scans the pixels 21 in the pixel array unit 11, sequentially in increments of rows, to read out the pixel signal VSL from the pixels 21. The pixel signals VSL to be read out from the pixels 21 are analog signals. The sweep scanning system performs sweep scanning on readout rows to be subjected to readout scanning by the readout scanning system, earlier than the readout scanning thereof, by an amount of time equivalent to the shutter speed.

Sweep scanning by this sweep scanning system sweeps out unnecessary charges from the photoelectric conversion units of the pixels 21 in the readout row, thus resetting the photoelectric conversion units. This sweep out of unnecessary charges (resetting) by the sweep scanning system realizes a so-called electronic shutter operation. Here, the term "electronic shutter operation" means operation to start a new exposure (to start storing of optical charges) by discarding the optical charges in the photoelectric conversion units.

The pixel signal VSL read out by the readout operation of the readout scanning system corresponds to the amount of light received since the last readout operation or electronic shutter operation thereof. The period from the readout timing at the last readout operation or from sweep timing at the last electronic shutter operation, to readout timing by this readout operation, is the exposure period in which optical charges are stored at the pixels 21.

The pixel signal VSL output from each pixel 21 in the pixel row selectively scanned by the vertical scanning circuit 12 is input to the A/D conversion unit 13 via each of the vertical scanning lines 17 for each pixel row.

The A/D conversion unit 13 includes multiple analog to digital converters (ADCs) 22. Each of the ADCs 22 is disposed corresponding to a pixel column in the pixel array unit 11. Each of the ADCs 22 executes correlated double sampling (CDS) processing and A/D conversion processing on the pixel signals VSL supplied from the pixels 21 in the same column via the vertical signal line 17.

A ramp signal RAMP of which the level (voltage) changes in a stepwise manner according to passage of time is supplied to the ADCs 22 from a DAC 18a in the reference signal generating unit 18.

The ADCs 22 each include a comparator 31 configured to compare the pixel signal VSL output from the pixels 21 in the same column of the pixel array unit 11 with the ramp signal RAMP from the DAC 18a, and an up/down counter 32 configured to count comparison time of the comparator 31.

The horizontal scanning circuit 14 is configured of a shift register, an address decoder, and so forth, and sequentially selects, for example, the ADC 22 corresponding to a pixel column in the A/D conversion unit 13. Selection scanning by this horizontal scanning circuit 14 sequentially outputs pixel data (pixel signals after A/D conversion) temporarily held at the ADCs 22.

The system control unit 15 is configured of a timing generator configured to generate various timing signals, and so forth, and performs driving control of the vertical scanning circuit 12, A/D conversion unit 13, horizontal scanning circuit 14, and so forth, based on the various timings generated at the timing generator.

The reference signal generating unit 18 includes at least the DAC 18a. The DAC 18a generates a ramp signal RAMP serving as a reference signal, and output this signal to each of the ADCs 22 in the A/D conversion unit 13.

The horizontal output line 19 is connected to the output unit (amplifier circuit) 20. The pixel signal after A/D conversion, output from each of the ADCs 22, is externally output from the solid-state imaging device 1, from the output unit 20 via the horizontal output line 19.

The solid-state imaging device 1 thus configured is a CMOS image sensor called a "column A/D type" where the ADCs 22 configured to perform the CDS processing and A/D conversion processing are disposed in increments of pixel columns. Also, the solid-state imaging device 1 is a CMOS image sensor with built-in image surface phase difference pixels, where the phase difference pixels 21P for focal-point detection are disposed in the pixel array unit 11.

1-2. Layout Example of Phase Difference Pixels

Figure 2:
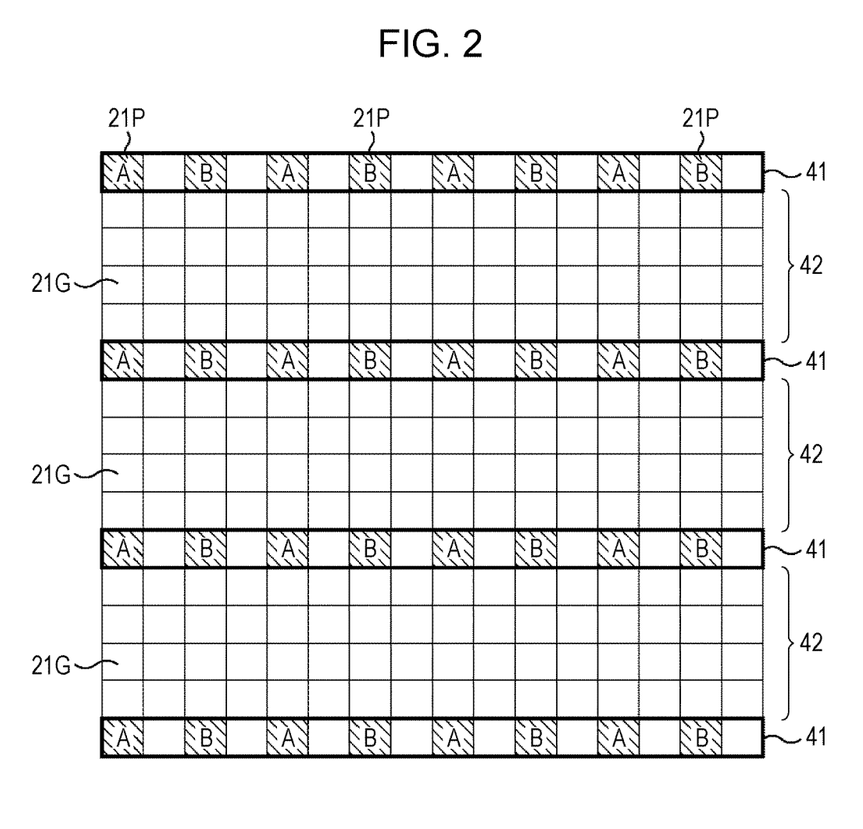
FIG. 2 is a diagram illustrating a layout example of normal pixels and phase difference pixels within a pixel array unit.

FIG. 2 is a diagram illustrating a layout example of the normal pixels 21G and phase difference pixels 21P within the pixel array unit 11.

The pixel rows in the pixel array unit 11 are classified into either phase difference pixel rows 41 where the phase difference pixels 21P are disposed between the normal pixels 21G, or normal pixel rows 42 where the normal pixels 21G alone are disposed. The phase difference pixel rows 41 are disposed at predetermined row intervals in the column direction. In the case of the example in FIG. 2, one phase difference pixels row 41 is disposed every four normal pixel rows 42.

The phase difference pixel rows 41 are configured such that the normal pixels 21G and phase difference pixels 21P are alternately disposed, as illustrated in FIG. 2, for example. Also, the phase difference pixels 21P include two types of pixels, namely type-A phase difference pixels 21P denoted by "A" in FIG. 2, and type-B phase difference pixels 21P denoted by "B". The type-A and type-B pixels are alternately disposed.

Note that the layout of the type-A and type-B pixels is not restricted to the example illustrated in FIG. 2, and any layout may be employed as long as the type-A and type-B pixels are employed as a pair. For example, an arrangement may be made wherein two phase difference pixel rows 41 adjacent in the vertical direction make up a pair, the type-A phase difference pixels 21P and normal pixels 21G are alternately disposed in one of the phase difference pixel rows 41, and the type-B phase difference pixels 21P and normal pixels 21G are alternately disposed in the other phase difference pixel row 41.

Figure 3A:
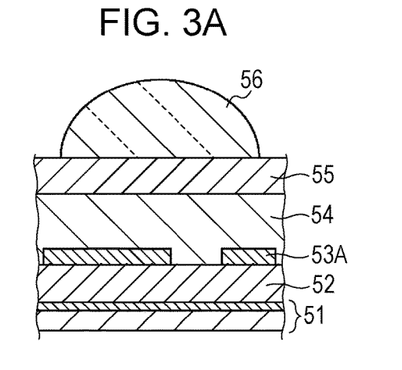
FIGS. 3A to 3D are diagrams for describing difference between type A and type B of phase difference pixels.

Difference between type-A and type-B phase difference pixels 21P will be described with reference to FIGS. 3A to 3D. FIG. 3A is a cross-sectional view illustrating a schematic configuration of the type-A phase difference pixel 21P, and FIG. 3B is a cross-sectional view illustrating a schematic configuration of the type-B phase difference pixel 21P.

In the case of the type-A phase difference pixel 21P, as illustrated in FIG. 3A, a light shielding film 53A is formed above a photoelectric conversion element 51 configured of a photodiode or the like, having a P-type first semiconductor layer 52 interposed therebetween, for example. Furthermore, a color filter 55 and an on-chip lens 56 are formed above the light shielding film 53A, having a planarization film 54 interposed therebetween.

Figure 3B:
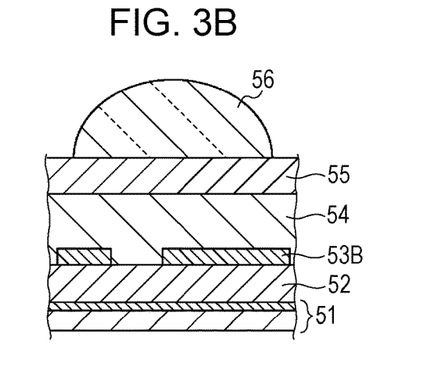

In the case of the type-B phase difference pixel 21P, similarly, as illustrated in FIG. 3B, a light shielding film 53B is formed above the photoelectric conversion element 51, having the first semiconductor layer 52 interposed therebetween. Furthermore, the color filter 55 and on-chip lens 56 are formed above the light shielding film 53B, having the planarization film 54 interposed therebetween. Accordingly, the only difference between the type-A and type-B of the phase difference pixels 21P is the difference between the light shielding film 53A and light shielding film 53B.

Figure 3C:
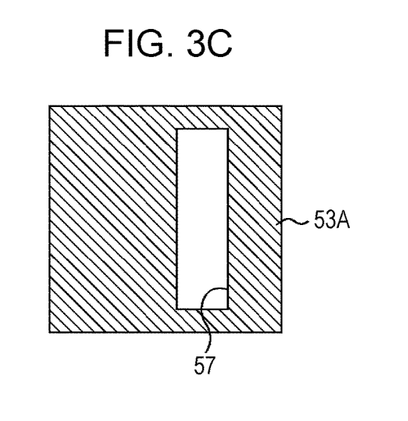
Figure 3D:
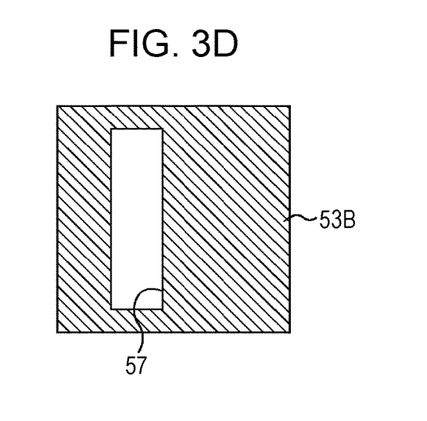

More specifically, as illustrated in FIGS. 3C and 3D which are diagrams viewing the light shielding film 53A and light shielding film 53B from the top surfaces, an opening portion 57 of the light shielding film 53A is disposed toward the right, and the position of the opening portion 57 of the light shielding film 53B is disposed toward the left, symmetrically as to the opening portion 57 of the light shielding film 53A. Thus, the type-A and type-B pixels are configured such that incident light input to the photoelectric conversion element 51 is received in a symmetrical manner in the horizontal direction or vertical direction.

Phase shift occurs between a pixel signal read out from the type-A phase difference pixel 21P and a pixel signal read out from the type-B phase difference pixel 21P, according to the difference between the formation positions of the opening portions 57 of the light shielding film 53A and light shielding film 53B. Autofocus may be achieved by calculating a defocus amount based on the phase shift amount of these two pixel signals, to adjust (move) a photographing lens.

1-3. A/D Conversion Operation of Normal Pixel Rows 42

The solid-state imaging device 1 in FIG. 1 performs AD conversion in the AF operation, for example, with an AD conversion resolution which is switched based on whether the pixel signals VSL is output from the phase difference pixel rows 41 or from the normal pixel rows 42. More specifically, A/D conversion is performed on the pixel signals VSL output from the phase difference pixel rows 41 with a higher A/D conversion resolution than that of the A/D conversion of the pixel signals VSL output from the normal pixel rows 42. Thus, AF focus precision employing the pixel signals VSL from the phase difference pixels 21P is improved at the solid-state imaging device 1.

Figure 4:
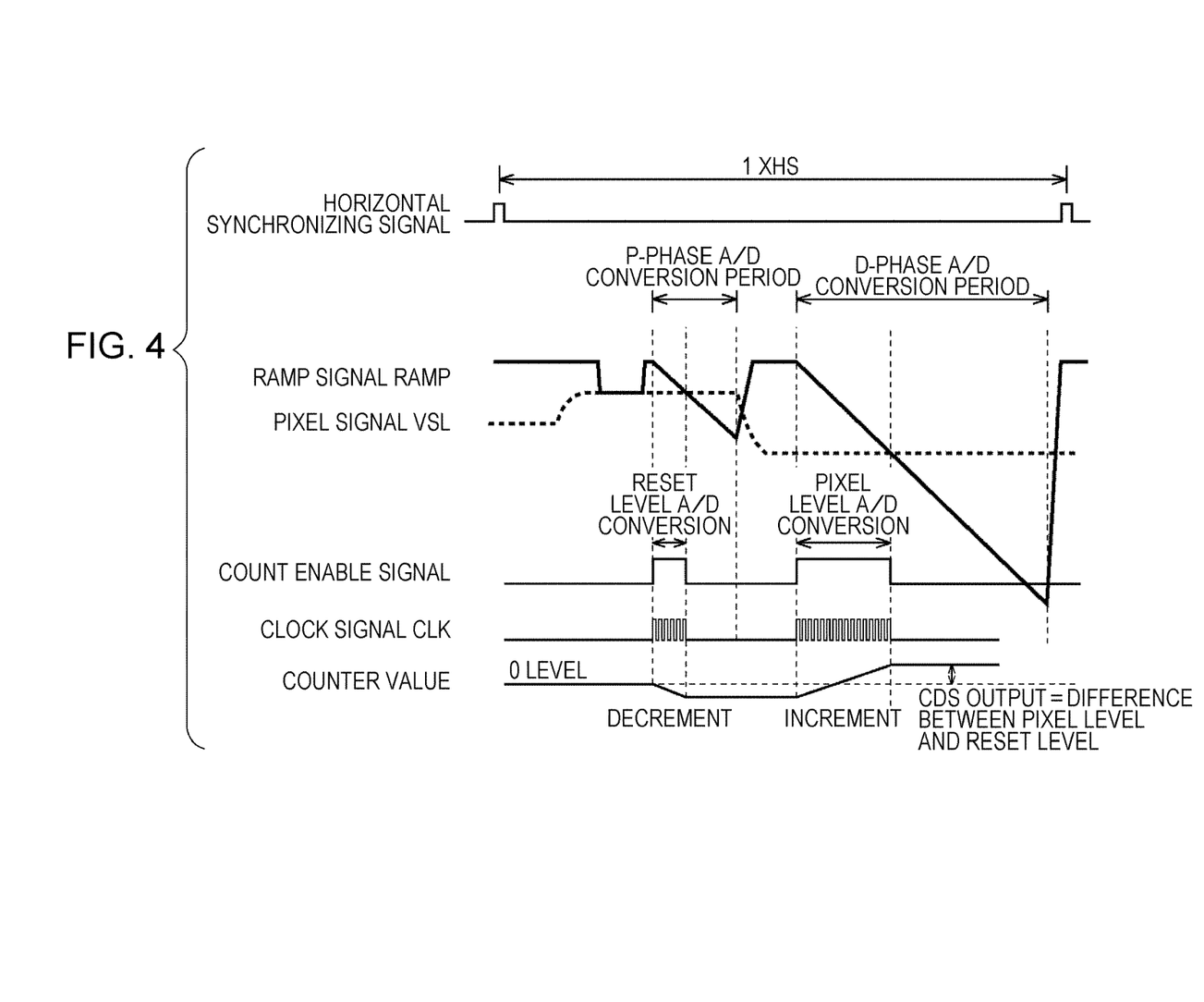
FIG. 4 is a diagram for describing A/D conversion operation of pixels of a normal pixel row.

Now, A/D conversion operation at the time of AF operation of the solid-state imaging device 1 will be described with reference to FIGS. 4 and 5. First, A/D conversion operation of the pixel signals VSL output from the normal pixels 21G in the normal pixel rows 42 will be described with reference to FIG. 4. FIG. 4 illustrates the ramp signal RAMP and pixel signal VSL input to the ADC 22, and count operation of the up/down counter 32.

A/D conversion operation of each normal pixel 21G in the normal pixel rows 42 is performed within one horizontal scanning period (1×HS). This one horizontal scanning period (1×HS) includes a P-phase (Preset Phase) A/D conversion period when performing A/D conversion on the reset level of the pixel signal VSL output from each normal pixel 21G in the normal pixel rows 42, and a D-phase (Data Phase) A/D conversion period when performing A/D conversion on the pixel level thereof.

The pixel signal VSL output from each normal pixel 21G in the normal pixel rows 42, and the ramp signal RAMP output from the DAC 18a in the reference signal generating unit 18 are input to the comparator 31.

The comparator 31 outputs a count enable signal to the up/down counter 32 based on a result when comparing the pixel signal VSL and ramp signal RAMP. Specifically, in the case that the ramp signal RAMP is greater than the pixel signal VSL, the comparator 31 outputs a Hi (High)-level count enable signal to the up/down counter 32. In the case that the ramp signal RAMP is smaller than the pixel signal VSL, the comparator 31 outputs the Lo (Low)-level count enable signal to the up/down counter 32.

The up/down counter 32 decrements based on a clock signal CLK from the system control unit 15 only while the Hi-level count enable signal is supplied during the first P-Phase A/D conversion period. Note that the pulses of the clock signal CLK indicate only a period when the up/down counter 32 is counted in FIG. 4.

The countdown value is held until the D-phase A/D conversion period comes. During the next D-phase A/D conversion period, the up/down counter 32 is incremented based on the clock signal CLK only while the Hi-level count enable signal is supplied.

The up/down counter 32 decrements the count value during the P-phase A/D conversion period, increments the count value during the D-phase A/D conversion period, and outputs the final count value as pixel data after the CDS processing and A/D conversion processing.

This CDS processing removes reset noise, and fixed pattern noise inherent in pixels, such as threshold variance of the amplifier transistors within pixels and so forth. Also, the A/D conversion processing converts analog pixel signals into digital signals. A pixel signal after A/D conversion is temporarily held at the ADC 22 until the pixel signal is output by the horizontal scanning circuit 14.

Now, an arrangement may be made wherein the up/down counter 32 increments the count value during the P-phase A/D conversion period, and decrements the count value during the D-phase A/D conversion period.

1-4. A/D Conversion Operation of Phase Difference Pixel Rows 41

Next, description will be made regarding A/D conversion operation of the pixel signals VSL output from the phase difference pixels 21P in the phase difference pixel rows 41, with reference to FIG. 5. In FIG. 5, the ramp signal RAMP output from the DAC 18a in the reference signal generating unit 18 is indicated by a solid line in the A/D conversion operation of the phase difference pixel rows 41. Also, the ramp signal RAMP output from the DAC 18a is indicated by a dashed line in the A/D conversion operation of the normal pixel rows 42 illustrated in FIG. 4, to facilitate comparison.

Figure 5:
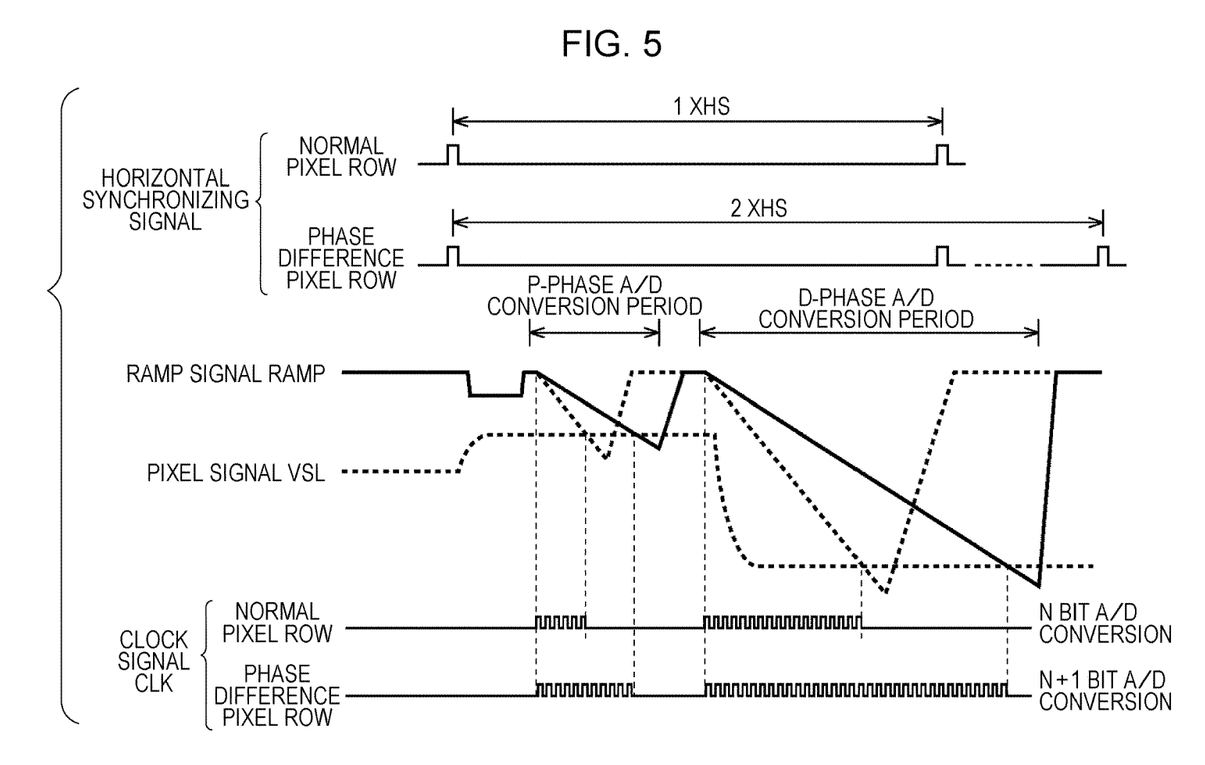
FIG. 5 is a diagram for describing A/D conversion operation of pixels in a phase difference pixel row.

The DAC 18a generates and outputs, as illustrated in FIG. 5, a ramp signal RAMP having a gentler slope in the A/D conversion operation of the phase difference pixel rows 41 than that in the A/D conversion operation of the normal pixel rows 42.

In this case, as illustrated in FIG. 5, it takes a longer time until the level of the ramp signal RAMP is equal to the level of the pixel signal VSL as compared to the case of the A/D conversion operation of the normal pixel rows 42. Thus, the counter value of the up/down counter 32 increases.

Accordingly, the A/D conversion resolution in the solid-state imaging device 1 may be increased at the phase difference pixel rows 41 including the phase difference pixels 21P, in comparison with the normal pixel rows 42. For example, in the case that the number of bits to be subjected to A/D conversion of the normal pixel rows 42 is N bits (N is a positive number), the number of bits to be subjected to A/D conversion of the phase difference pixel rows 41 may be set as N+1 bits.

Note that it takes longer with this arrangement for the level of the ramp signal RAMP to be equal to the level of the pixel signal VSL, and consequently, the count time of the up/down counter 32 is correspondingly longer. Accordingly, the solid-state imaging device 1 performs A/D conversion operation on the normal pixel rows 42 for one horizontal scanning period (1×HS), but performs A/D conversion operation on the phase difference pixel rows 41 for twice as many times, that is, two horizontal scanning periods (2×HS).

1-5. Video Usage Pixel Area During AF Operation

Figure 6:
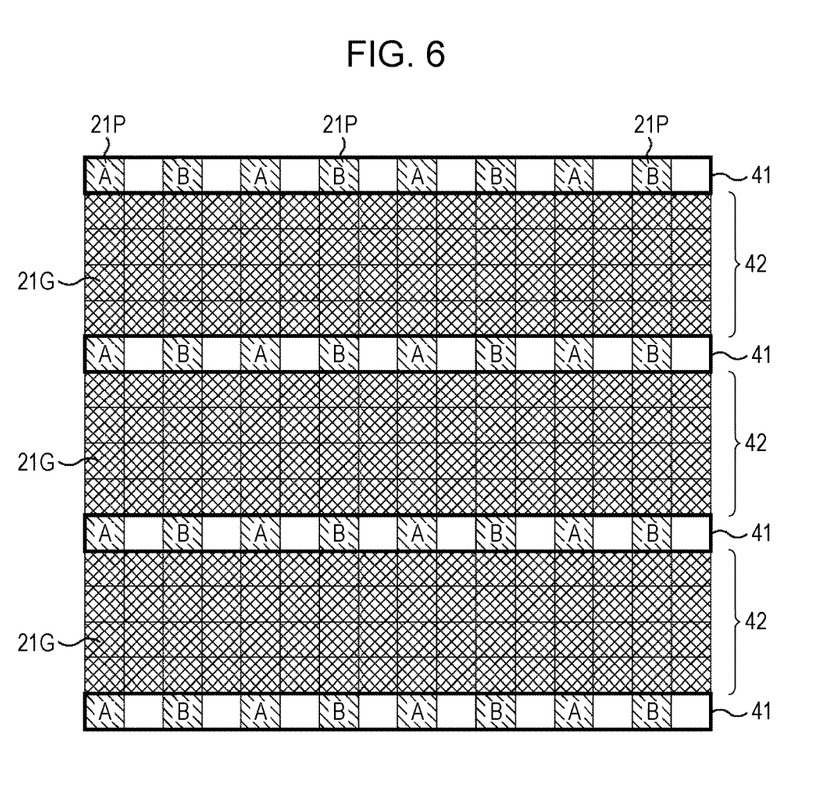
FIG. 6 is a diagram illustrating a pixel area used for generation of video.

FIG. 6 illustrates a pixel area used for video generation during AF operation. Only the hatched pixel signals alone in the normal pixel rows 42 in FIG. 6 are used for video generation during AF operation. For example, a video based on the pixel signals in the normal pixel row 42 is displayed on a monitor of a digital camera under AF operation. Now, an arrangement may be made wherein the pixel signals in the phase difference pixel rows 41 are interpolated by the pixel signals in the normal pixel rows 42, and the interpolated pixels are displayed on the monitor as video at the time of AF operation.

The pixel signal of each normal pixel 21G in the phase difference pixel rows 41 is not used for video generation, and only the pixel signals in the phase difference pixels 21P are used for focal-point detection.

The sequence to read out pixel signals from the pixel array unit 11 may be such that the pixel signals are sequentially read out in the column direction from a predetermined pixel row within the pixel array unit 11 (e.g., the topmost pixel row), or that the phase difference pixel rows 41 and normal pixel rows 42 are read out separately. For example, an arrangement may be made wherein the normal pixel rows 42 alone are read out first, and thereafter, A/D conversion resolution, that is, the slope of the ramp signal RAMP is changed, and the phase difference pixel rows 41 are read out.

In the case of an operation mode wherein the A/D conversion resolution of the phase difference pixel rows 41 as described above is improved, as illustrated in FIG. 6, the number of pixels used for video generation is less than the maximum pixel number of the pixel array unit 11. Therefore, this operation mode may be used at the time of AF operation for imaging a still image, or at the time of taking a moving image with lower resolution than that of a still image. Note that, in the case of imaging with the maximum pixel number of the pixel array unit 11, the solid-state imaging device 1 may also perform A/D conversion on the phase difference pixel rows 41 with the same A/D conversion resolution as that of the normal pixel rows 42, and obtain by interpolation the values of the pixels of the video signal equivalent to the pixel positions of the phase difference pixels 21P, using surrounding normal pixels at a signal processing circuit called a digital signal processor (DSP) provided to the output of the solid-state imaging device 1.

As described above, the solid-state imaging device 1 in FIG. 1 generates, for example, at the time of AF operation, a ramp signal RAMP having a different slope (tilt) depending on the phase difference pixel rows 41 where the phase difference pixels 21P are disposed and the normal pixel rows 42 where the phase difference pixels 21P are not disposed, and outputs this signal to the A/D conversion unit 71. Thus, the solid-state imaging device 1 generates a ramp signal RAMP having a different slope depending on whether the ramp signal RAMP is compared with the normal pixels 21G or the ramp signal RAMP is compared with the phase difference pixels 21P, and outputs this signal to the A/D conversion unit 71.

Thus, A/D conversion time in the configuration where the frame rate adaptively varies is longer regarding the phase difference pixel rows 41 alone. Accordingly, degradation in the frame rate may be suppressed even after improving the AF focus precision in comparison with the case of improving the AF focus precision in a state in which the A/D conversion time of the normal pixel rows 42 agrees with the A/D conversion time of the phase difference pixel rows 41.

2. Second Embodiment

2-1. Overall Configuration Example of Solid-State Imaging Device

Figure 7:
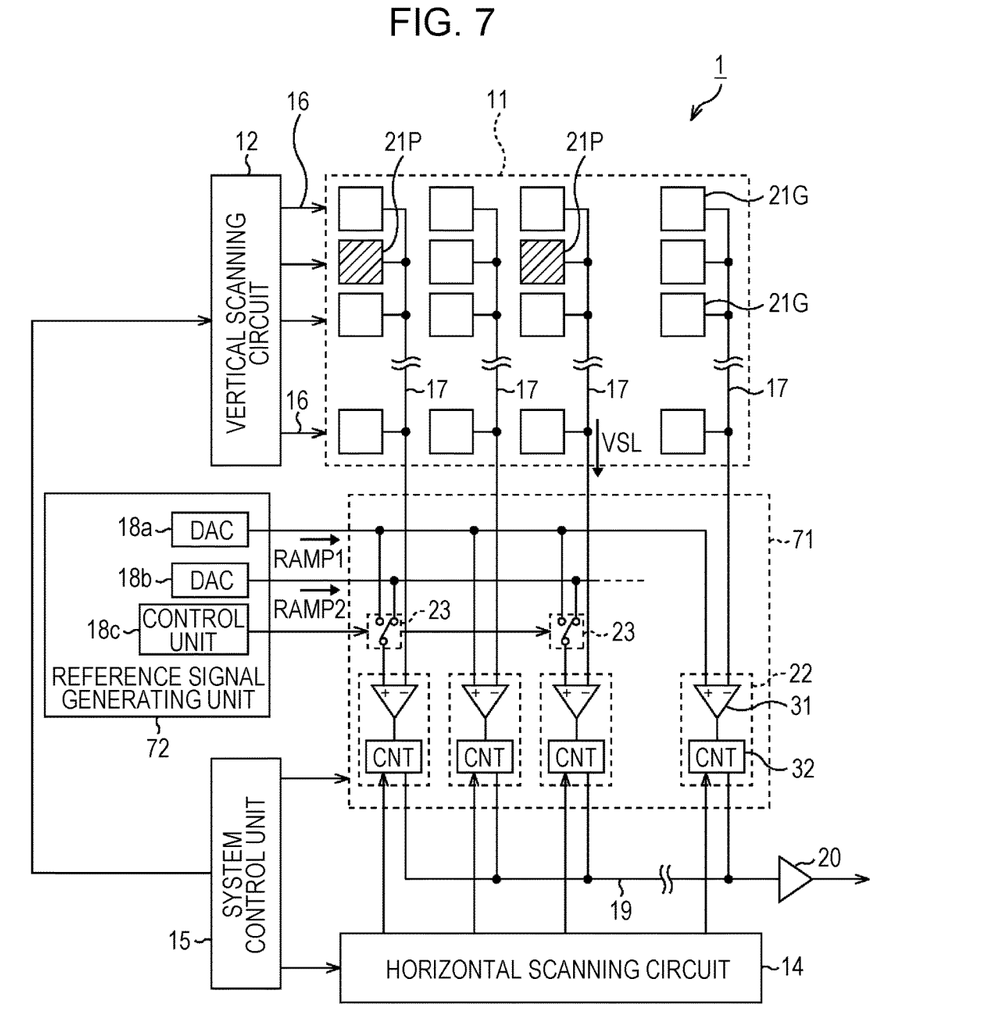
FIG. 7 is a block diagram illustrating a schematic configuration of a solid-state imaging device according to a second embodiment of the present technology.

FIG. 7 is a block diagram illustrating a schematic configuration of a solid-state imaging device according to a second embodiment of the present technology. In FIG. 7, portions corresponding to the first embodiment are denoted with the same reference numerals, and only portions different from the first embodiment will be described in the following description.

A solid-state imaging device 1 illustrated in FIG. 7 includes a pixel array unit 11, a vertical scanning circuit 12, an A/D conversion unit 71, a horizontal scanning circuit 14, a system control unit 15, pixel driving lines 16, vertical signal lines 17, a reference signal generating unit 72, a horizontal output line 19, an output unit 20, and so forth.

Specifically, the solid-state imaging device 1 according to the second embodiment differs from the solid-state imaging device 1 according to the first embodiment regarding the configurations of the A/D conversion unit 71 and reference signal generating unit 72.

The A/D conversion unit 71 differs from the A/D conversion unit 13 according to the first embodiment in that a selector 23 is newly provided in front of the input port of the ADC 22 for the ramp signal RAMP corresponding to a pixel column where the phase difference pixels 21P are disposed. The reference signal generating unit 72 differs from the reference signal generating unit 18 according to the first embodiment in that, in addition to the DAC 18a, another DAC 18b and a control unit 18c are provided.

The selector 23 includes two input ports and one output port. A ramp signal RAMP1 output from the DAC 18a is input to one of the input ports, and a ramp signal RAMP2 output from the DAC 18b is input to the other input port. The selector 23 selects one of the ramp signal RAMP1 and the ramp signal RAMP32 under control of the control unit 18c of the reference signal generating unit 72, and outputs the selected signal.

The DAC 18a generates a ramp signal RAMP1 for the normal pixels 21G, and outputs the signal to the A/D conversion unit 71. On the other hand, the DAC 18b generates a ramp signal RAMP2 for the phase difference pixels 21P, and outputs the signal to the A/D conversion unit 71. The ramp signal RAMP1 and ramp signal RAMP2 differ in the slopes (level change ratio according to passage of time) of the ramp signals, and the ramp signal RAMP2 has a gentler slope than the slope of the ramp signal RAMP1.

The control unit 18c controls the selectors 23 in sync with pixel signal readout operation of each pixel 21 in the pixel array unit 11. Specifically, in the case that the pixel signal VSL of the normal pixel 21G is input from the pixel array unit 11 to the comparator 31 in the ADC 22, the control unit 18c performs control so as to select the ramp signal RAMP1 which the DAC 18a outputs. In the case that the pixel signal VSL of the phase difference pixel 21P is input to the comparator 31 in an ADC 22, performs control so as to select the ramp signal RAMP2 which the DAC 18b outputs. Note that this processing is performed in increments of pixels.

2-2. A/D Conversion Operation According to Second Embodiment

Figure 8:
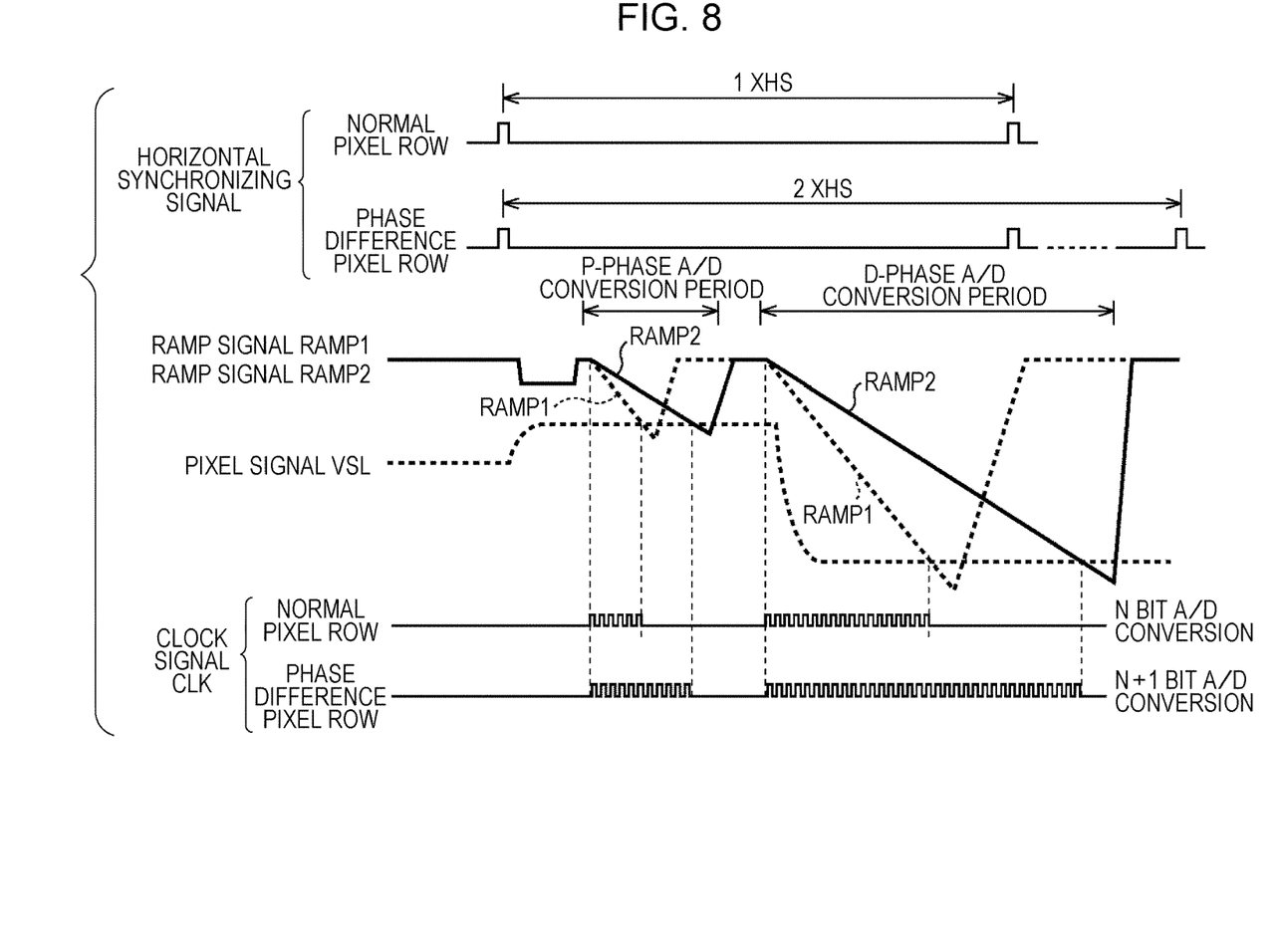
FIG. 8 is a diagram for describing A/D conversion operation according to the second embodiment.

A/D conversion operation of the solid-state imaging device 1 according to the second embodiment will be described with reference to FIG. 8. In FIG. 8, the ramp signal RAMP1 for the normal pixels 21G which the DAC 18a outputs is indicated with a dashed line, and the ramp signal RAMP2 for the phase difference pixels 21P which the DAC 18b outputs is indicated with a solid line.

In the case that the normal pixel rows 42 in the pixel array unit 11 have been selected as readout rows, the selector 23 selects the ramp signal RAMP1 which the DAC 18a outputs under control of the control unit 18c, and outputs this signal.

As a result thereof, the pixel signals VSL of all of the normal pixels 21G in the normal pixel rows 42 are compared with the ramp signal RAMP1, and the ADCs 22 execute the CDS processing and A/D conversion processing for one horizontal scanning period (1×HS).

On the other hand, in the case that the phase difference pixel rows 41 in the pixel array unit 11 have been selected as readout rows, the selectors 23 corresponding to the normal pixels 21G select and output the ramp signal RAMP1 which the DAC 18a outputs, under control of the control unit 18c. The selectors 23 corresponding to the phase difference pixels 21P also select and output the ramp signal RAMP2 which the DAC 18b outputs, under control of the control unit 18.

As a result thereof, the pixel signals VSL output from the normal pixels 21G in the phase difference pixel rows 41 are level-compared with the ramp signal RAMP1, and the pixel signals VSL output from the phase difference pixels 21P in the phase difference pixel rows 41 are level-compared with the ramp signal RAMP2. Thus, the pixel signals VSL of the phase difference pixels 21P are subjected to A/D conversion with higher A/D conversion resolution than that of the pixel signals VSL of the normal pixels 21G. For example, in the case that the number of bits of the normal pixels 21G to be subjected to A/D conversion is N bits, the number of bits to be subjected to A/D conversion of the phase difference pixels 21P may be set to N+1 bits. Note that this processing is performed in increments of pixels.

The A/D conversion operation time for the phase difference pixel rows 41 has to agree with the A/D conversion operation time of the phase difference pixels 21P. Thus, the A/D conversion operation time for the phase difference pixel rows 41 is set to two horizontal scanning periods (2×HS).

2-3. Video Usage Pixel Area According to Second Embodiment

Figure 9:
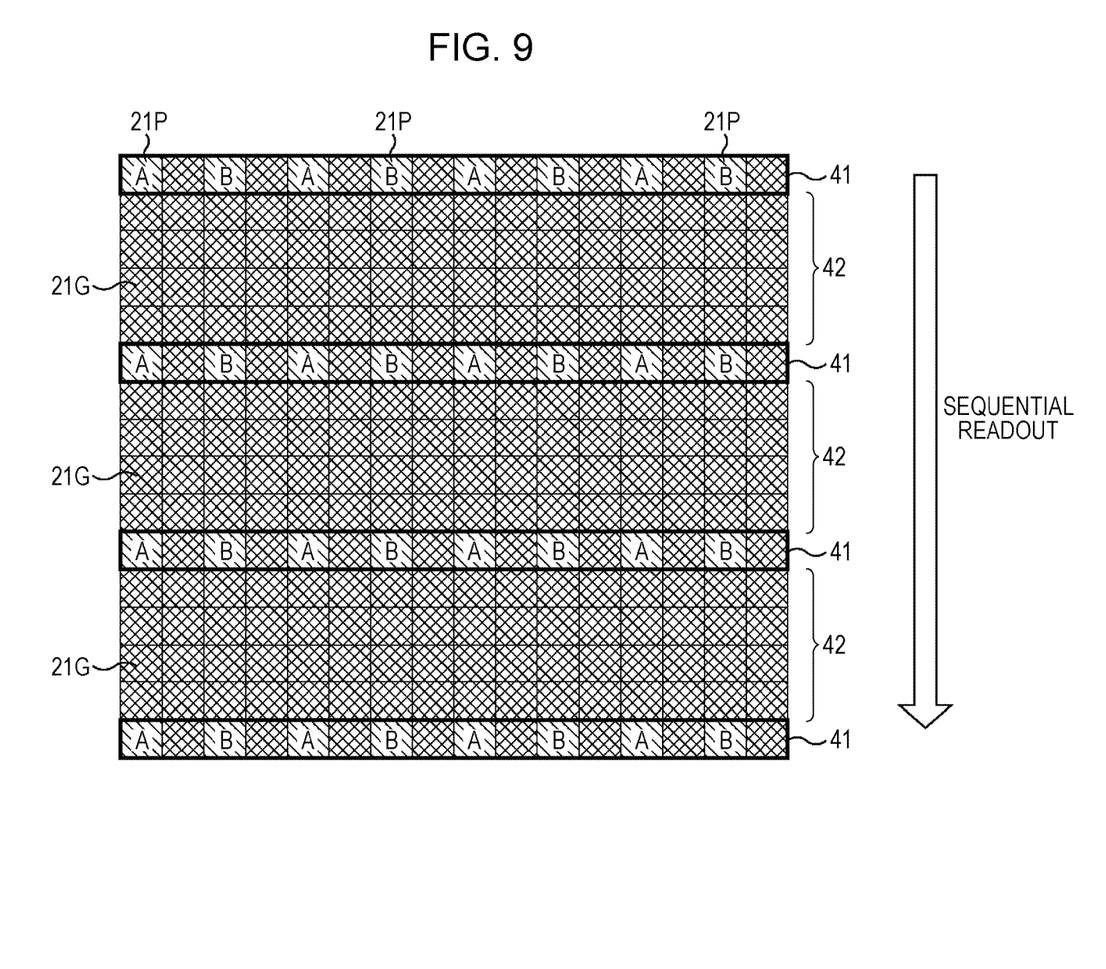
FIG. 9 is a diagram illustrating a pixel area used for generation of video.

FIG. 9 illustrates a pixel area used for video generation in the solid-state imaging device 1 according to the second embodiment.

In the case of the first embodiment, the A/D conversion resolution of the normal pixels 21G in the phase difference pixel rows 41 differs from the A/D conversion resolution of the normal pixels 21G in the normal pixel rows 42. Accordingly, the pixel signals VSL of the normal pixels 21G in the phase difference pixel rows 41 have not been used.

In the second embodiment, the A/D conversion resolution of the normal pixels 21G in the phase difference pixel rows 41 agrees with the A/D conversion resolution of the normal pixels 21G in the normal pixel rows 42. Accordingly, it is easy to use the pixel signals VSL of the normal pixels 21G in the phase difference pixel rows 41 for video generation.

Thus, in addition to the pixel signals VSL of the normal pixels 21G in the normal pixel rows 42, the pixel signals VSL of the normal pixels 21G in the phase difference pixel rows 41 are also used for video generation, as indicated by hatching in FIG. 9. The values of the pixels of the video signal equivalent to the pixel positions of phase difference pixels 21P in the phase difference pixel rows 41 are obtained by interpolation from the pixel signals of the normal pixels 21G surrounding the phase difference pixel 21P in the signal processing circuit (DSP) provided to the output of the solid-state imaging device 1.

The solid-state imaging device 1 reads out the pixel signals VSL in each pixel row within the pixel array unit 11 in the line sequence in the column direction. The A/D conversion unit 71 performs A/D conversion on the pixel signals VSL in the normal pixel rows 42 and the normal pixels 21G in the phase difference pixel rows 41 for one horizontal scanning period (1×HS). The A/D conversion unit 71 also performs A/D conversion on the pixel signals VSL of the phase difference pixels 21P in the phase difference pixel rows 41 for two horizontal scanning periods (2×HS).

As described above, the second embodiment enables the reference signal generating unit 72 to output the ramp signal RAMP1 for the normal pixels 21G, and the ramp signal RAMP2 for the phase difference pixels 21P at the same time. Accordingly, the pixel signals VSL of the normal pixels 21G in the phase difference pixel rows 41 may also readily be used. Further, pixel data after A/D conversion having improved resolution may be obtained regarding the phase difference pixels 21.

The second embodiment prolongs count time according to increase in the resolution regarding the phase difference pixel rows 41 alone at the time of the A/D conversion operation. On the other hand, normal A/D conversion time regarding the normal pixel rows 42 is maintained. Thus, AF focus precision may be improved while suppressing increase in the A/D conversion time and degradation of the frame rate.

Note that description has been made regarding an example wherein the A/D conversion time at the phase difference pixel rows 41 has been set to two horizontal scanning periods (2×HS), as to one horizontal scanning period (1×HS) which is the A/D conversion time at the normal pixel rows 42, and the number of bits to be subjected to A/D conversion of the phase difference pixels 21P has been increased to N+1 bits as to the N bits of the normal pixels 21G. Specifically, the length of the D-phase A/D conversion period is doubled, whereby the resolution may be doubled by doubling the number of bits. Alternatively, the length of the D-phase A/D conversion period is doubled, the maximum count value is doubled, and consequently, the number of bits is doubled, whereby the resolution may be doubled. Note that in the case of this example, the signal processing circuit (DSP) provided to the subsequent stage has to perform different processing by recognizing that the normal pixels 21G and phase difference pixels 21P differ in resolution.

However, the slope of the ramp signal RAMP2 for the phase difference pixels 21P may optionally be set by adjusting gain within the DAC 18b, and accordingly, the number of bits to be subjected to A/D conversion of the phase difference pixels 21P may also optionally be set. For example, the number of bits to be subjected to A/D conversion of the phase difference pixels 21P may be set to N+2 bits or N+3 bits as to the N bits of the normal pixels 21G. Note that increase in the increment of the number of bits to be subjected to A/D conversion of the phase difference pixels 21P as to the number of bits to be subjected to A/D conversion of the normal pixels 21G prolongs the A/D conversion time. Accordingly, the range which is settable for charge storage time at each pixel 21 in the phase difference pixel rows 41 is shortened correspondingly.

Application Example to Electronic Device

The above-described solid-state imaging device 1 may be applied to various electronic devices, for example, such as an imaging apparatus like a digital still camera, digital video camera, or the like, a cellular phone having imaging functions, or an audio player having imaging functions.

Figure 10:
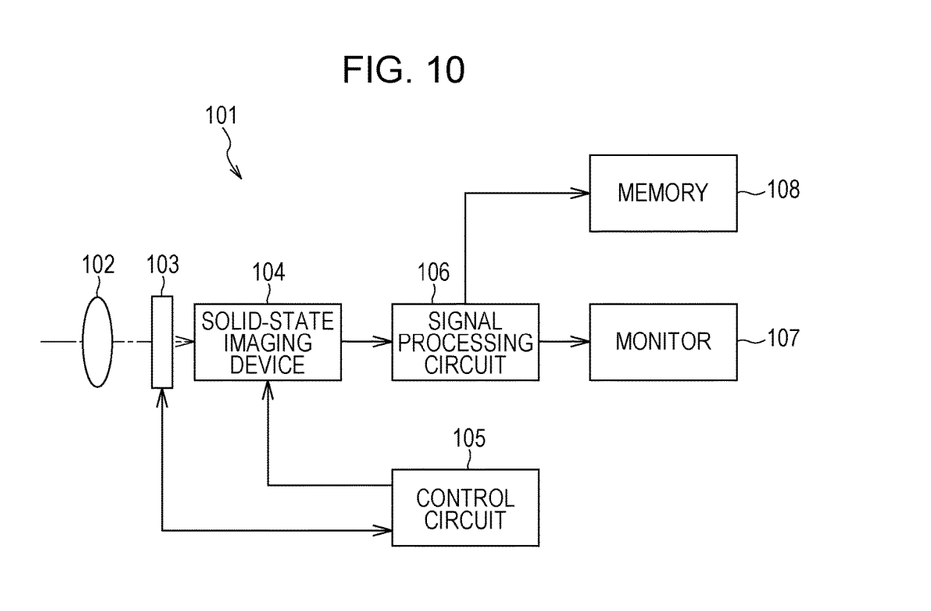
FIG. 10 is a block diagram illustrating a configuration example of an imaging apparatus serving as an electronic device according to an embodiment of the present technology.

FIG. 10 is a block diagram illustrating a configuration example of an imaging apparatus serving as an electronic device to which an embodiment of the present technology has been applied.

An imaging apparatus 101 illustrated in FIG. 10 includes an optical system 102, a shutter device 103, a solid-state imaging device 104, a control circuit 105, a signal processing circuit 106, a monitor 107, and memory 108, and is capable of imaging a still image and a moving image.

The optical system 102 is configured of a single or multiple lenses, guides light (incident light) from a subject to the solid-state imaging device 104, and forms an image on the light-receiving surface of the solid-state imaging device 104.

The shutter device 103 is disposed between the optical system 102 and solid-state imaging device 104, and controls light irradiation periods and light shielding periods as to the solid-state imaging device 104 under control of the control circuit 105.

The solid-state imaging device 104 is configured of the above-described solid-state imaging device 1. The solid-state imaging device 104 stores signal charges for a certain period of time according to light of which the image is formed on the light-receiving surface via the optical system 102 and shutter device 103. The signal charges stored in the solid-state imaging device 104 are transferred in accordance with a driving signal (timing signal) supplied from the control circuit 105. The solid-state imaging device 104 may be configured as a stand-alone one-chip configuration, or may be configured as a portion of a camera module packaged with the optical system 102 through signal processing circuit 106 and so forth.

The control circuit 105 outputs a driving signal for controlling transfer operation of the solid-state imaging device 104, and shutter operation of the shutter device 103 to drive the solid-state imaging device 104 and shutter device 103.

The signal processing circuit 106 subjects a pixel signal output from the solid-state imaging device 104 to various types of signal processing. An image (image data) obtained by the signal processing circuit 106 subjecting the pixel signal to the signal processing is displayed by being supplied to the monitor 107, or stored (recorded) by being supplied to the memory 108.

Embodiments of the present technology are not restricted to the above-mentioned embodiments, and various modifications may be made without departing from the essence of the present technology.

Note that the present technology may have the following configurations.

(1) A solid-state imaging device including: a pixel array unit in which there are arrayed in a matrix form a plurality of pixels including a plurality of normal pixels which are pixels for video output, and a plurality of phase difference pixels which are pixels for focal-point detection; an A/D conversion unit configured to compare pixel signals output from the pixels of the pixel array unit with a ramp signal serving as a reference signal, thereby performing A/D conversion on the pixel signals; and a control unit configured to perform control so that the ramp signal to be compared with the phase difference pixels has a different slope from that of the ramp signal to be compared with at least a part of the normal pixels.

(2) The solid-state imaging device according to (1), further including: a reference signal generating unit configured to generate the ramp signal.

(3) The solid-state imaging device according to (2), wherein the reference signal generating unit includes a first D/A converter configured to generate a first ramp signal, and a second D/A converter configured to generate a second ramp signal of which the slope is gentler than that of the first ramp signal; wherein the first D/A converter outputs the first ramp signal to the A/D conversion unit to which pixel signals output from the normal pixels are input; and wherein the second D/A converter outputs the second ramp signal to the A/D conversion unit to which pixel signals output from the phase difference pixels are input.

(4) The solid-state imaging device according to (3), wherein a predetermined pixel row of the pixel array unit is configured of the normal pixels and the phase difference pixels; wherein the first D/A converter outputs the first ramp signal to the A/D conversion unit to which pixel signals output from the normal pixels of the predetermined pixel row are input; and wherein the second D/A converter outputs the second ramp signal to the A/D conversion unit to which pixel signals output from the phase difference pixels of the predetermined pixel row are input.

(5) The solid-state imaging device according to (1), wherein the reference signal generating unit generates a ramp signal having different slopes for a pixel row where the phase difference pixels in the pixel array unit are disposed, and for a pixel row where the phase difference pixels are not disposed, and outputs the ramp signal to the A/D conversion unit.

(6) The solid-state imaging device according to (1) or (5), wherein the pixel array unit outputs pixel signals of all of the pixel rows where the phase difference pixels are not disposed to the A/D conversion unit, and subsequently outputs pixel signals of a pixel row where the phase difference pixels are disposed to the A/D conversion unit.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a pixel array that includes a plurality of pixels arrayed in a matrix form,
   wherein the plurality of pixels comprise a plurality of normal pixels for image output and a plurality of phase difference pixels for focal-point detection; and
   an A/D converter configured to:
   convert, by A/D conversion, at least one normal pixel signal output from at least one normal pixel of the plurality of normal pixels with a first resolution; and
   convert, by the A/D conversion, at least one phase difference signal output from at least one phase difference pixel of the plurality of phase difference pixels with a second resolution higher than the first resolution,
   wherein a first number of bits subjected to the A/D conversion of the at least one normal pixel signal is smaller than a second number of bits subjected to the A/D conversion of the at least one phase difference signal.

2. The solid-state imaging device according to claim 1, further comprising:
   a reference signal generator configured to generate at least one ramp signal,
   wherein the A/D converter is further configured to compare the at least one normal pixel signal with the at least one ramp signal to generate an output signal.

3. The solid-state imaging device according to claim 2, wherein the reference signal generator includes a D/A converter configured to generate the at least one ramp signal,
   wherein the D/A converter is further configured to output the at least one ramp signal to the A/D converter.

4. The solid-state imaging device according to claim 2, wherein a D/A converter is configured to output the at least one ramp signal to the A/D converter.

5. The solid-state imaging device according to claim 1, further comprising a reference signal generator configured to:
   generate at least one ramp signal; and
   output the at least one ramp signal to the A/D converter.

6. The solid-state imaging device according to claim 1, wherein the pixel array is configured to output the at least one normal pixel signal to the A/D converter and subsequently output the at least one phase difference signal to the A/D converter.

7. The solid-state imaging device according to claim 1, further comprising:
   a reference signal generator configured to generate at least two ramp signals,
   wherein the at least two ramp signals comprise a first ramp signal and a second ramp signal,
   wherein the A/D converter comprises:
   a first comparator configured to compare the at least one normal pixel signal with the first ramp signal; and
   a second comparator configured to compare the at least one phase difference signal with the second ramp signal.

8. The solid-state imaging device according to claim 7, wherein the A/D converter further comprises:
   a first counter configured to count a first comparison time of the first comparator; and
   a second counter configured to count a second comparison time of the second comparator,
   wherein both of the first counter and the second counter have a same clock frequency.

9. A solid-state imaging device, comprising:
   a pixel array that includes a plurality of pixels arrayed in a matrix form,
   wherein the plurality of pixels comprise a plurality of normal pixels for image output and a plurality of phase difference pixels for focal-point detection;
   a selector configured to selectively output at least two ramp signals, wherein the at least two ramp signals include a first ramp signal and a second ramp signal; and
   an A/D converter configured to:
   convert, by A/D conversion, at least one normal pixel signal output from at least one normal pixel of the plurality of normal pixels with a first resolution, based on a comparison of the at least one normal pixel signal with the first ramp signal; and
   convert, by the A/D conversion, at least one phase difference signal output from at least one phase difference pixel of the plurality of phase difference pixels with a second resolution higher than the first resolution, based on a comparison of the at least one phase difference signal with the second ramp signal, wherein a first number of bits subjected to the A/D conversion of the at least one normal pixel signal is smaller than a second number of bits subjected to the A/D conversion of the at least one phase difference signal.

10. The solid-state imaging device according to claim 9, further comprising:

a reference signal generator configured to generate the at the least two ramp signals, wherein the A/D converter is further configured to compare the at least one normal pixel signal with the at least two ramp signals to generate an output signal.

11. The solid-state imaging device according to claim 10, wherein the reference signal generator includes a D/A converter configured to generate the at least two ramp signals, wherein the D/A converter is further configured to output the at least two ramp signals to the A/D converter.

12. A solid-state imaging device, comprising:

a pixel array that includes a plurality of pixels arrayed in a matrix form, wherein the plurality of pixels comprise a plurality of normal pixels for image output and a plurality of phase difference pixels for focal-point detection;

a reference signal generator configured to generate at least two ramp signals including a first ramp signal and a second ramp signal; and an A/D converter including a first comparator configured to compare at least one normal pixel signal outputted from at least one normal pixel of the plurality of normal pixels with the first ramp signal and a second comparator configured to compare at least one phase difference signal outputted from at least one phase difference pixel of the plurality of phase difference pixels with the second ramp signal so that the A/D converter is configured to convert the at least one normal pixel signal outputted from at least one normal pixel of the plurality of normal pixels with a first resolution and convert the at least one phase difference signal outputted from at least one phase difference pixel of the plurality of phase difference pixels with a second resolution, wherein the second resolution is higher than the first resolution.

13. The solid-state imaging device according to claim 12, wherein the pixel array is configured to output the at least one normal pixel signal to the A/D converter and subsequently output the at least one phase difference signal to the A/D converter.

14. The solid-state imaging device according to claim 12, wherein a D/A converter is configured to output the first ramp signal and the second ramp signal to A/D converter.

15. A solid-state imaging device, comprising:

a pixel array that includes a plurality of pixels arrayed in a matrix form, wherein the plurality of pixels comprise a plurality of normal pixels for image output and a plurality of phase difference pixels for focal-point detection;

a selector configured to selectively output at least two ramp signals including a first ramp signal and a second ramp signal;

an A/D converter including a first comparator configured to compare at least one normal pixel signal output from at least one normal pixel of the plurality of normal pixels with the first ramp signal; and a second comparator configured to compare at least one phase difference signal output from at least one phase difference pixel of the plurality of phase difference pixels with the second ramp signal, wherein the A/D converter is configured to:

convert the at least one normal pixel signal outputted from at least one normal pixel of the plurality of normal pixels with a first resolution; and convert at least one phase difference signal outputted from at least one phase difference pixel of the plurality of phase difference pixels with a second resolution, wherein the second resolution is higher than the first resolution.

16. The solid-state imaging device according to claim 15, wherein the pixel array is configured to output the at least one normal pixel signal to the A/D converter and subsequently output the at least one phase difference signal to the A/D converter.

* * * * *